United States Patent
Johnson

(10) Patent No.: US 10,622,277 B2
(45) Date of Patent: Apr. 14, 2020

(54) HEAT DISSIPATION ASSEMBLY

(71) Applicant: HONEYWELL FEDERAL MANUFACTURING & TECHNOLOGIES, LLC, Kansas City, MO (US)

(72) Inventor: Matthew Johnson, Overland Park, KS (US)

(73) Assignee: Honeywell Federal Manufacturing & Technologies, LLC, Kansas City, MO (US)

(*) Notice: Subject to any disclaimer, the term of this patent is extended or adjusted under 35 U.S.C. 154(b) by 12 days.

(21) Appl. No.: 16/006,227

(22) Filed: Jun. 12, 2018

(65) Prior Publication Data
US 2018/0331014 A1 Nov. 15, 2018

Related U.S. Application Data

(60) Continuation of application No. 15/159,275, filed on May 19, 2016, now abandoned, which is a division of application No. 14/086,835, filed on Nov. 21, 2013.

(51) Int. Cl.
*H01L 23/373* (2006.01)
*H01L 23/367* (2006.01)
*H01L 21/48* (2006.01)

(52) U.S. Cl.
CPC ...... *H01L 23/3735* (2013.01); *H01L 21/4882* (2013.01); *H01L 23/3677* (2013.01); *H01L 2224/48095* (2013.01); *H01L 2224/73265* (2013.01); *H01L 2924/0002* (2013.01)

(58) Field of Classification Search
CPC ............ H01L 23/3735; H01L 21/4882; H01L 23/3677; H01L 2224/73265; H01L 2224/48095; H01L 2924/0002
See application file for complete search history.

(56) References Cited

U.S. PATENT DOCUMENTS

| | | | | |
|---|---|---|---|---|
| 5,117,281 A * | 5/1992 | Katsuraoka | ........... | H01L 23/367 257/722 |
| 5,386,339 A * | 1/1995 | Polinski, Sr. | ....... | H01L 23/3735 174/252 |
| 6,861,750 B2 * | 3/2005 | Zhao | ................... | H01L 23/3677 257/666 |
| 6,921,971 B2 * | 7/2005 | Basho | ................... | H01L 23/057 257/675 |
| 7,202,561 B2 * | 4/2007 | Seo | ..................... | H01L 23/3128 257/669 |
| 7,948,069 B2 * | 5/2011 | Zhuang | ................. | H01L 23/047 257/678 |
| 2007/0023889 A1 * | 2/2007 | Salmon | ................ | G02B 6/4228 257/698 |
| 2007/0090522 A1 * | 4/2007 | Alhayek | ............. | H01L 23/3677 257/723 |
| 2009/0260858 A1 * | 10/2009 | Nakai | .................. | H05K 1/0206 174/252 |
| 2010/0103623 A1 * | 4/2010 | Kwank | ................... | H01L 23/13 361/709 |

(Continued)

*Primary Examiner* — Gordon A Jones
(74) *Attorney, Agent, or Firm* — Hovey Williams LLP

(57) ABSTRACT

A heat dissipating assembly including a layered stack of materials with a highly thermally conductive path for cooling a circuit, the stack including a structurally isolated material having a high coefficient of thermal expansion connected between materials having low coefficients of thermal expansion.

9 Claims, 2 Drawing Sheets

(56) References Cited

U.S. PATENT DOCUMENTS

2014/0293554 A1* 10/2014 Shashkov ............ C25D 11/024
                                                        361/748
2017/0243816 A1* 8/2017 Kwark .................... H01L 23/13

* cited by examiner

HEAT DISSIPATION ASSEMBLY

RELATED APPLICATIONS

This patent application is a continuation, and claims priority benefit with regard to all common subject matter, of earlier-filed U.S. patent application Ser. No. 15/159,275, filed on May 19, 2016, and entitled "HEAT DISSIPATION ASSEMBLY". Application Ser. No. 15/159,275 is a divisional application of U.S. patent application Ser. No. 14/086,835, filed on Nov. 21, 2013, and entitled "Heat DISSIPATION ASSEMBLY". The identified earlier-filed non-provisional patent applications are hereby incorporated by reference in their entireties into the present application.

GOVERNMENT INTERESTS

The present invention was developed with support from the U.S. government under a contract with the United States Department of Energy, Contract No. DE-NA0000622. Accordingly, the U.S. government has certain rights in the present invention.

BACKGROUND

Embodiments of the present invention relate to assemblies for dissipating heat in electronic circuits.

Heat dissipating assemblies used with electrical circuits often include multiple layers of materials having high thermal conductivity for quickly removing heat away from the circuit. Multiple layers are required due to geometric, electronic, and manufacturing limitations for any single material. For example, an electrical circuit may have a complex shape with a complex heat profile, so the layer of the heat dissipation assembly connected to the circuit must be formed into a complementary complex shape to closely bond to the circuit at high heat-generating areas. Other layers of the heat dissipation assembly do not need to have a complex shape but must be able to dissipate heat quickly. The coefficients of thermal expansion (CTE), the amount that the materials expand for an amount of heat applied to them, of these materials vary widely. The different expansion rates may result in the generation of high stresses, which may cause fractures in the materials or may cause the layers to separate. These fractures or separations introduce air into the heat dissipation path, causing heat to build up in the dissipation assembly, which may cause circuit overheating.

Accordingly, there is a need for an improved heat dissipating assembly that overcomes the above-described limitations.

SUMMARY

Embodiments of the present invention solve the above-mentioned problems and provide a distinct advance in the art of heat dissipating assemblies. More particularly, embodiments of the invention provide a heat dissipating assembly including a layered stack of materials with a highly thermally conductive path for cooling a circuit, the stack including a structurally isolated material (having a coefficient of thermal expansion (CTE) unmatched to the CTE of the circuit) connected between materials having CTEs matched to the CTE of the circuit. Having matched CTEs means essentially that over a normal manufacturing and operating temperature range, for specific sizes and geometries of the parts, and for specific construction of the assembly, failures due to thermal stresses are not normal. The layered stack is constructed in a way that the structurally isolated material, which is a relatively soft material (i.e., a material having a low modulus of elasticity), dissipates thermally induced stresses and strains by deforming within the layered stack.

One embodiment of the heat dissipation assembly includes a heat spreader for connecting to an electrical circuit, a substrate connected to the heat spreader on a first side of the substrate, a heat slug connected to the heat spreader on a first side of the heat slug and adjacent to the substrate, and a backplate connected to the heat slug and the substrate on second sides opposite the first sides of the heat slug and the substrate. The heat spreader, the substrate, and the backplate form layers of materials with a highly thermally conductive path for cooling the circuit. The heat spreader and the circuit have matching CTEs, and the substrate and the backplate have matching CTEs. In this way, the heat spreader and the backplate provide structural support with minimal stress buildup while the heat slug is disposed between the heat spreader and the backplate for dissipating thermally induced stresses and strains and for dissipating heat away from the circuit to the backplate.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figure 1:
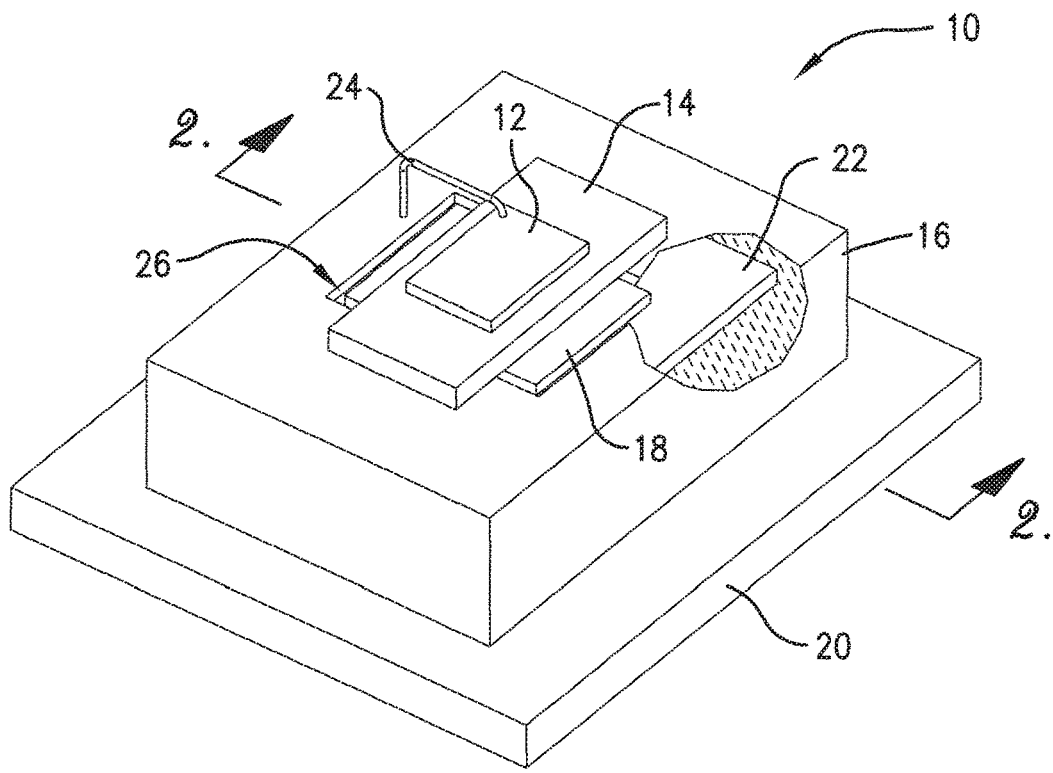
FIG. 1 is a top perspective view of a heat dissipation assembly constructed in accordance with an embodiment of the invention.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention may be practiced. The embodiments are intended to describe aspects of the invention in sufficient detail to enable those skilled in the art to practice the invention. Other embodiments may be utilized and changes may be made without departing from the scope of the current invention. The following detailed description is, therefore, not to be taken in a limiting sense. The scope of the current invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology may include a variety of combinations and/or integrations of the embodiments described herein.

Figure 2:
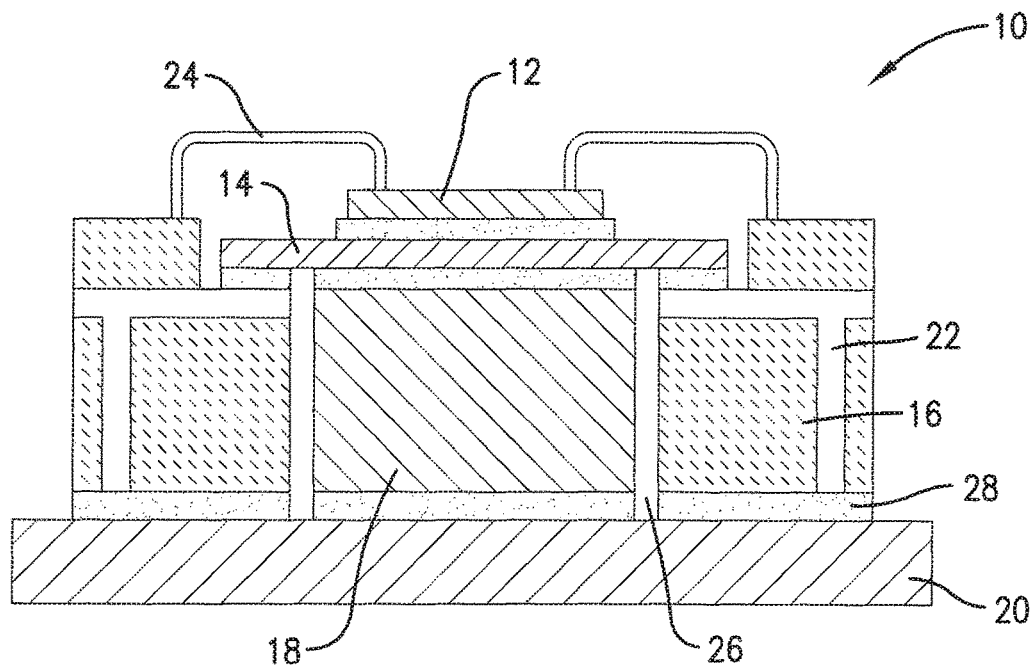
FIG. 2 is a cross section view of the assembly of FIG. 1.
Figure 3:
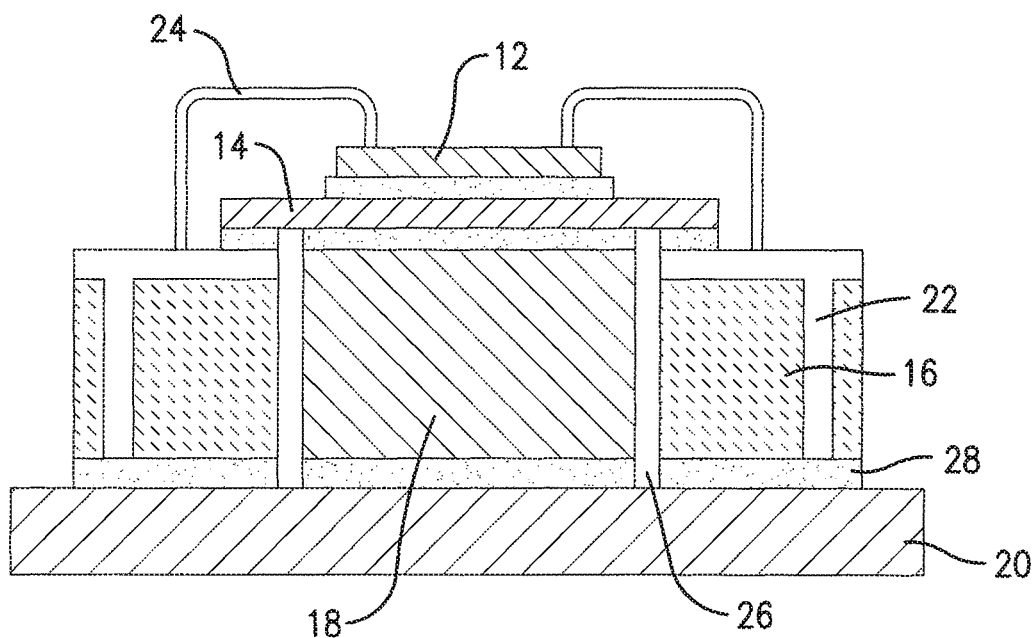
FIG. 3 is a cross section view of a heat dissipation assembly wherein the heat spreader overlaps a first portion of a surface-level RF ground plane of the substrate, in accordance with an embodiment of the invention.

Turning to the figures, and initially FIGS. 1 and 2, a heat dissipation assembly 10 for dissipating heat in an electronic circuit 12 is shown. An embodiment of the assembly 10 has multiple layers of materials with high thermal capacities including a heat spreader 14 for connecting to the circuit 12, a substrate 16 connected to the heat spreader 14, a heat slug 18 connected to the heat spreader 14, and a backplate 20 connected to the heat slug 18 and the substrate 16. The heat slug 18 is structurally isolated between the heat spreader 14 and the backplate 20, for reasons described below. In this description, "matching CTEs" means that over a normal manufacturing and operating temperature range, for specific sizes and geometries of the parts, and for specific construction of the assembly, failures due to thermal stresses are not normal. Factors that determine whether two CTEs are matched include temperature ranges to which the components are subjected, the modulus of elasticity of each component, the Poisson's ratio of each component, size and geometry of each component, and alignment between the components. For exemplary purposes only, "matching CTEs" may mean two CTEs being the same or having a difference of less than approximately 3 ppm/° C. It will be understood that for various assemblies, matching CTEs may be within larger or smaller ranges. The circuit 12 and the heat spreader 14 have matching CTEs. The substrate 16, and the backplate 20 have matching CTEs. The CTEs of the circuit 12 and the heat spreader 14 may match the CTEs of the substrate 16 and the backplate 20. The heat slug 18 may have a CTE unmatched with the aforementioned CTEs. Because the heat slug 18 is structurally isolated between the heat spreader 14 and the backplate 20, the heat slug 18 may comfortably or compliantly expand or shift relative to the heat spreader 14 or the backplate 20 without causing a structural failure therebetween as may happen if the components are conventionally constructed.

In more detail, and as shown in FIGS. 1-4, the exemplary circuit 12 is an integrated circuit chip but may be any kind of heat generating electronic circuit or circuit component such as a resister, capacitor, amplifier, or computer component such as a hard drive, display, or processor. The circuit 12 may be formed of Gallium-arsenide, Gallium-nitride, Silicon, Silicon-carbide, Germanium, laminated FR4, Duroid®, or other material. The circuit 12 may have a complex geometry such as one having a plurality of edges, contours, curves, angles, depressions, etched surfaces, and mounted elements. The complex geometry may also include bosses, protrusions, or mounts for connecting the circuit 12 to the heat spreader 14. The circuit 12 may be manufactured using complex manufacturing processes such as printing, molding, or assembling. The circuit 12 may also have a complex heat profile, meaning the circuit 12 does not uniformly generate heat across its surface(s). That is, certain areas or parts generate more heat than others.

The heat spreader 14 is a plate, bar, board, wafer, or similar layer that is connected to and draws heat away from the circuit 12. The heat spreader 14 may be made of any material that has a high material strength, a high thermal conductance to efficiently remove heat from the circuit 12, and a CTE that matches the CTE of the circuit 12 so that stresses are minimized when the heat spreader 14 increases in temperature and expands. For example, the heat spreader 14 may be formed of Aluminum, Aluminum-silicon-carbide, Copper-tungsten, Tungsten-nickel-copper alloys, Nickel-chromium alloys, Nickel-iron alloys, Diamond, Copper, Copper-molybdenum, Kovar, Alloy 42, MET Graph 350 composite, or other material. The heat spreader 14 may have a CTE slightly lower than the CTE of the circuit 12 (e.g., 0.001 to 3 ppm/° C. lower) which results in non-damaging compression on the circuit 12 when the assembly increases in temperature. The heat spreader 14 may also exert tension or sheer forces on the circuit 12.

Figure 4:
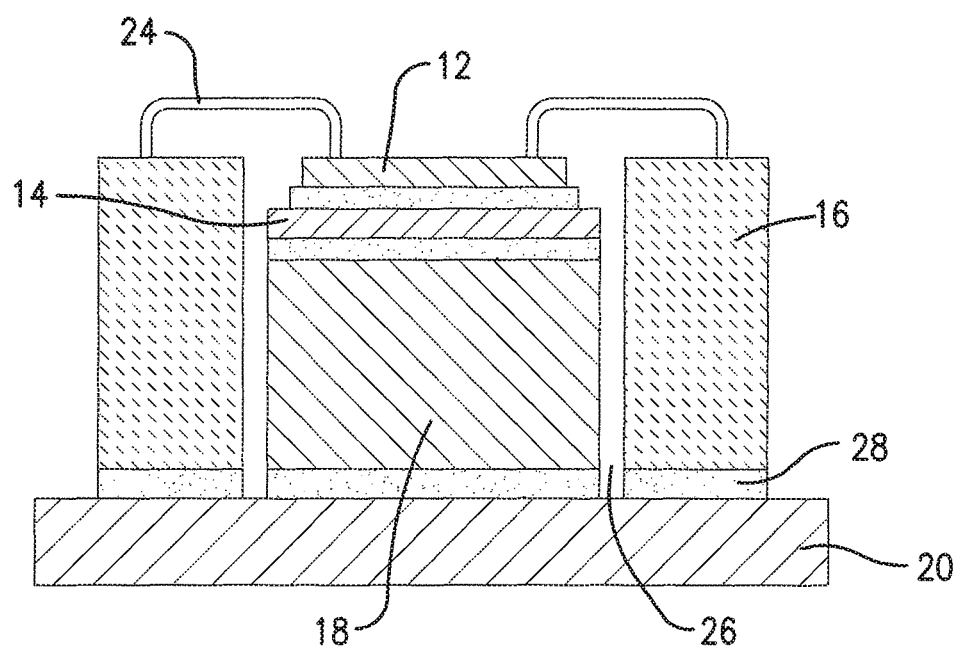
FIG. 4 is a cross section view of a heat dissipation assembly wherein the heat spreader and the heat slug are disposed within a cavity of the substrate.

The heat spreader 14 may have a complex geometry complementary or conformable to the complex shape and/or heat profile of the circuit 12 so that the heat spreader 14 is configured to be connected to the circuit 12 and to efficiently remove heat from higher heat-generating areas of the circuit 12. The heat spreader 14 also may be shaped to reduce electrical or radio frequency (RF) interference such as having a "continuous" grounding plane (i.e., a plate or a large surface). The heat spreader 14 may also be shaped to minimize a wire bond length between the circuit 12 and the substrate 16. The complex geometry may include bosses, protrusions, or mounts for connecting the heat spreader 14 to the circuit 12. The heat spreader 14 may be connected to the circuit 12 via fasteners, clamps, bonding such as soldering, glue, welding, conductive epoxy, or other connection means (described below). The heat spreader 14 is also connected to the substrate 16 and heat slug 18 on a side opposite that of the circuit 12. The heat spreader 14 may extend over the substrate 16 (FIGS. 1-3) or may be disposed between portions of the substrate 16 (FIG. 4). The heat spreader 14 and the circuit 12 may be removed from the substrate 16 and the heat slug 18 and replaced, and the substrate 16 and the heat slug 18 may be reused, if the circuit 12 is determined to be defective or broken.

The substrate 16 may be formed of a low temperature co-fired ceramic (LTCC), a high temperature co-fired ceramic (HTCC), Aluminum-nitride, Aluminum-oxide, Beryllium-oxide, laminated FR4, Duroid®, a printed wire assembly/printed wire board, a wafer, or other material having a CTE matching the CTE of the backplate 20. Again, having matching CTEs reduces stresses between the materials. The substrate 16 does not necessarily need to have a high thermal conductivity. This is because heat from the circuit 12 primarily travels through the heat slug 18, described below. The substrate 16 is connected to the heat spreader 14 on a first side of the substrate 16 via fasteners, clamps, bonding such as soldering, glue, or welding, or other connection means, as described below, and may extend above the heat spreader, as shown in FIG. 2. In some embodiments, the substrate 16 includes a cavity 26 or a space that extends to opposite sides of the substrate 16, so as to form a through-hole or a through-space wherein the heat slug 18 is disposed. In this way, the substrate 16 acts as a spacer between the heat spreader 14 and the backplate 20. The substrate 16 may also include a continuous ground plane 22 for reducing RF interference. The ground plane 22 may be embedded in (FIGS. 1 and 2), printed on (FIG. 3), or connected to the substrate 16. The ground plane 22 is connected to the heat spreader 14 via conductive bonding material such as epoxy or solder. The ground plane 22 may instead be connected via a low inductance wire 24, cable, or other electrical connector to the circuit 12 or the heat spreader 14 to form a grounding connection. Alternatively, the substrate 16 may have a plurality of wires (not shown) emanating therefrom for connecting to the circuit 12. The geometry of the substrate 16 (and the heat spreader 14 as mentioned above) enables the length of the wire 24 to be minimized. The wire 24 may be connected to the substrate 16 and the circuit 12 via fasteners, clamps, bonding such as soldering, glue, welding, conductive epoxy, thermosonic or thermocompressive wire bonding, or other means, as described below.

The heat slug 18 has a high thermal conductivity and a CTE that does not necessarily match the CTEs of the circuit 12, the heat spreader 14, the substrate 16, and/or the backplate 20. The heat slug 18 may have a low material strength for conformably or compliantly expanding, deforming, or shifting relative to the stronger heat spreader 14 and/or backplate 20 without inducing a structural failure. Thus, the heat slug 18 may be formed of a material such as high purity Copper, high purity Gold, high purity Platinum, Silver, Aluminum-silicon alloy, Copper-tungsten alloy, Kovar, Alloy 42, Diamond composites, or graphite materials such as thermally pyrolytic graphite or graphite-metal composites. These materials are difficult to form into precise or complex shapes, and so the heat slug 18 may be formed into a simple shape with very few features. In one embodiment, the heat slug 18 has a uniform cross sectional shape and is formed by a cost effective manufacturing process such as extrusion. The heat slug 18 is connected to the heat spreader 14 on the second side of the heat spreader 14 (opposite the circuit 12) and on a first side of the heat slug 18. The heat slug 18 is also connected to the backplate 20 (described below) on a second side of the heat slug 18 opposite the first side, so that the heat slug 18 is situated in between the heat spreader 14 and the backplate 20. The heat slug 18 is also adjacent to the substrate 16 and/or disposed in the cavity 26, so that the heat slug 18 is attached to the heat spreader 14 near a first end of the cavity 26 and attached to the backplate 20 near a second end of the cavity 26. The heat slug 18 may be connected to the heat spreader 14 and the backplate 20 via fasteners, clamps, bonding such as soldering, glue, welding, conductive epoxy, or other means, as described below.

The backplate 20 has a high material strength, a high thermal conductivity, and a CTE that matches the CTE of the substrate 16 to prevent the buildup of stresses therebetween, and is formed of Aluminum, Aluminum-silicon-carbide, Copper-tungsten, Tungsten-nickel-copper alloys, Nickel-chromium alloys, Nickel-iron alloys, Diamond, Copper, Copper-molybdenum, Kovar, Alloy 42, MET Graph 350 composite, or other material. The backplate 20 sandwiches the heat slug 18 and the substrate 16 between the heat spreader 14 and itself to isolate the heat slug 18 therebetween.

The above components are connected via connectors 28 such as Tin-lead, Indium-lead, or Gold-tin solders, Diemat, ABLEBOND®, or LORD® epoxy, brazes, welds, glue, adhesives, fasteners, clamps, or other means. The connectors 28 connecting the heat spreader 14 to the heat slug 18 and the heat slug 18 to the backplate 20 may be flexible, malleable, compressible, or expandable compared to the materials that form the heat spreader 14, the heat slug 18, the substrate 16, and the backplate 20. Therefore, when the heat slug 18 expands at a greater rate than the heat spreader 14, the substrate 16, and the backplate 20, the solder, epoxy, etc. reversibly compresses, squeezes, or deforms without forming cracks or other failures. The solder, epoxy, etc. also may decompress as the heat slug 18 retracts, thereby forming a constant, thermally conductive connection between the heat slug 18 and the heat spreader 14 and the heat slug 18 and the backplate 20. The connectors 28 may also be electrically conductive and may help to minimize electrical or RF interference.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. An assembly for dissipating heat in an electronic circuit, the assembly comprising:
    an alloy heat spreader having a high thermal conductivity for drawing heat from the electronic circuit, the heat spreader being a plate having mounts for connecting the heat spreader to the electronic circuit;
    a ceramic substrate bonded to the heat spreader on a first side of the substrate, the substrate having a ground plane embedded in the substrate, the heat spreader extending over a portion of the substrate and the ground plane, at least a portion of the substrate extending above the heat spreader, the heat spreader being removably connected to the substrate via fasteners for replacing the electronic circuit and the heat spreader with a replacement electronic circuit and a replacement heat spreader, the substrate having a lower thermal conductivity than a thermal conductivity of the heat spreader;
    a heat slug having a high thermal conductivity and being bonded to the heat spreader via electrically conductive connector material on a first side of the heat slug and adjacent to the substrate, the heat slug having a uniform cross-sectional shape; and
    an alloy backplate having a high thermal conductivity and being connected to the substrate on a second side of the substrate opposite the first side of the substrate and bonded to the heat slug on a second side of the heat slug opposite the first side of the heat slug via electrically conductive connector material, the heat spreader, the substrate, and the backplate forming a layered stack of materials with a highly thermally conductive path for cooling the electronic circuit, the heat slug having a lower material strength than material strengths of the heat spreader, the substrate, and the backplate, wherein the heat spreader, the substrate, and the backplate have coefficients of thermal expansion differing by less than 3 parts-per-million per degree Celsius from each other and differing by at least 3 parts-per-million per degree Celsius from a coefficient of thermal expansion of the heat slug, the connector material bonding the heat slug to the heat spreader and the connector material bonding the backplate to the heat slug being reversibly compressible so as to form a constant, thermally conductive connection between the heat slug and the heat spreader and between the backplate and the heat slug.

2. The assembly of claim 1, wherein the substrate includes a cavity having a first opening and a second opening on opposite sides of the substrate, and the heat slug is disposed in the cavity and connected to the heat spreader near the first opening and connected to the backplate near the second opening.

3. The assembly of claim 1, wherein the heat spreader is formed of a single piece of material.

4. The assembly of claim 1, wherein the heat spreader is shaped to have continuous radio frequency grounding.

5. The assembly of claim 1, wherein the substrate is configured to be connected to the electronic circuit via a low inductance wire.

6. The assembly of claim 1, wherein the connector material bonding the heat slug to the heat spreader and the connector material bonding the backplate to the heat slug are epoxy.

7. The assembly of claim 1, wherein the connector material bonding the heat slug to the heat spreader and the connector material bonding the backplate to the heat slug are solder.

8. The assembly of claim 1, wherein the heat slug and the substrate are made of a preformed material so that stresses induced when the layered stack is at a minimum temperature and stresses induced when the layered stack is at a maximum temperature are of equal magnitude, so that maximum induced stress is minimized.

9. The assembly of claim 1, wherein the backplate includes a planar surface, and the substrate and the heat slug are connected to the backplate via the planar surface.

* * * * *